United States Patent [19]
Foerster et al.

[11] Patent Number: 5,760,586
[45] Date of Patent: Jun. 2, 1998

[54] NUCLEAR MAGNETIC RESONANCE SPECTROMETER

[76] Inventors: Hans Foerster, Kirchgasse 5, D-76744, Woerth; Klaus Zick, Vorholzstrasse 25, D-76137, Karlsruhe, both of Germany

[21] Appl. No.: 564,683

[22] Filed: Dec. 1, 1995

[30] Foreign Application Priority Data

Dec. 1, 1994 [DE] Germany ............... 44 42 742.5

[51] Int. Cl.$^6$ .......................................... G01V 3/00
[52] U.S. Cl. ............................ 324/321; 324/318
[58] Field of Search ........................ 324/321, 322, 324/318, 307, 309, 300; 128/653.5

[56] References Cited

U.S. PATENT DOCUMENTS

| | | | |
|---|---|---|---|
| 4,899,111 | 2/1990 | Pines et al. | 324/321 |
| 4,968,938 | 11/1990 | Pines et al. | 324/321 |
| 4,968,939 | 11/1990 | Pines et al. | 324/321 |
| 5,159,271 | 10/1992 | Llor | 324/321 |
| 5,260,657 | 11/1993 | Lewis et al. | 324/321 |
| 5,298,864 | 3/1994 | Müller et al. | 324/321 |

FOREIGN PATENT DOCUMENTS 0 136 642 B1  1/1988  European Pat. Off. ....... G01N 24/02

OTHER PUBLICATIONS

Doty Scientific, Inc.; "Leading the way in NMR probe technology" 1994.

NMR Resonance 86, 470–487 (1990); "Dynamic–Angle Spinning of Quadrupolar Nuclei" (Mueller).

*Primary Examiner*—Louis M. Arana
*Attorney, Agent, or Firm*—Claude A.S. Hamrick

[57] ABSTRACT

A probehead in a nuclear magnetic resonance spectrometer is disclosed. The probehead comprises a sample holder supporting a sample under investigation. The sample is spinned about a spinning axis. The sample holder is tilted with its spinning axis by an angle with respect to a probehead longitudinal axis. The longitudinal axis coincides with the principal direction of a surrounding constant magnetic field. A servo-mechanical actuator is provided for varying the angle. The actuator is driven by a force derived from the magnetic field.

16 Claims, 1 Drawing Sheet

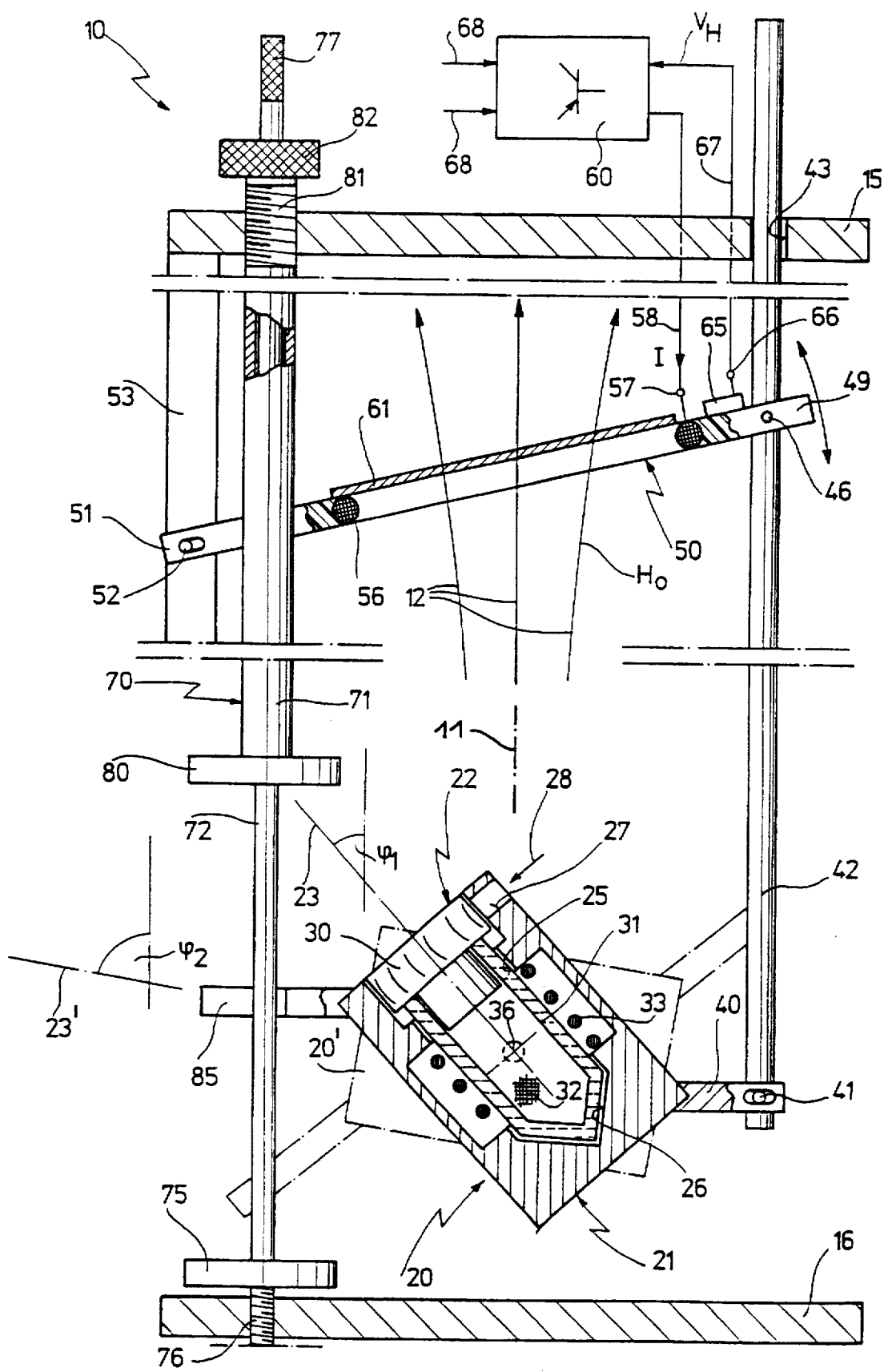

NUCLEAR MAGNETIC RESONANCE SPECTROMETER

FIELD OF THE INVENTION

This invention relates to the field of nuclear magnetic resonance spectrometers. More specifically, the invention is directed to probeheads within nuclear magnetic resonance spectrometers.

Still more specifically, the invention is related to a probehead for nuclear magnetic resonance spectroscopy comprising a sample holder supporting a sample to be spinned about a spinning axis, the sample holder being tilted with its spinning axis by an angle with respect to a probehead longitudinal axis, the longitudinal axis coinciding with the principal direction of a surrounding constant magnetic field, servo-mechanical means being provided for varying the angle.

BACKGROUND OF THE INVENTION

A probehead of the afore-mentioned kind is disclosed in "Journal of Magnetic Resonance" 86(1990), pp. 470–487, in particular pp. 477–479. A commercially available probehead of the afore-mentioned kind is, further, described in a brochure entitled "Doty Scientific Inc. Introducing: Doty DAS III Dynamic Angle Spinning", April 1994.

In the art of nuclear magnetic resonance solid state spectroscopy it is well-known to orient a sample with respect to the surrounding constant magnetic field other than by conventional 90° but tilted under the so-called "magic angle" of 54.7° instead. This measuring technique is normally referred to as "magic-angle spinning" (MAS).

In the course of further elaborated MAS techniques, experiments have become known incorporating a variation of the tilting angle during the measurement. In particular, experiments have become known during which the sample was excited in a first angular position, the sample being then switched with respect to its angular position into a second angular position for measuring the signal evolution resulting from the excitation.

In the prior art experimental setup as disclosed in the "Journal of Magnetic Resonance" article cited above and as shown in the commercial brochure mentioned above, a sample holder is used that can be tilted about an axis extending at right angles to the magnetic field principal direction. The tilting motion within this prior art probehead is generated by means of a stepped motor. For that purpose, the stepped motor is provided with a toothed wheel driving a toothed belt which, in turn, is connected to the sample holder. The prior art probehead is configured to allow a tilting angle adjustment between 37.38° and 79.19°. This range of angle variation may be sweeped through within a time interval of 36 ms. The prior art probehead, further, allows a closed-loop position control in that an angle sensor is arranged on the stepped motor toothed wheel for controlling the tilted position of the sample holder by means of an appropriate feedback.

However, this prior art probehead has various drawbacks:

A first disadvantage results from the fact that the stepped motor by itself generates a magnetic field which may be embarrassing at the sample position when high-resolution nuclear magnetic resonance measurements are conducted. Therefore, it is necessary to locate the stepped motor at a considerable distance from the sample location. This, again, requires a toothed belt of considerable length. As a consequence, the angular control may not be precise due to the unavoidable elasticity of the toothed belt. Moreover, switch-over times are relatively long and, for many samples, exceed the relaxation time. In the prior art probehead the switch-over time is, further, limited by the fact that when using a stepped motor, relatively big masses have to be displaced for varying the sample holder orientation.

U.S. Pat. No. 4,968,938 discloses another probehead for nuclear magnetic resonance spectroscopy of the kind mentioned at the outset. For tilting the sample holder with its spinning axis about an angle with respect to the probehead longitudinal axis, an actuator is provided which, preferably, may be operated pneumatically.

U.S. Pat. No. 5,260,657 discloses another such probehead having a sample holder which may be tilted by mechanical means.

U.S. Pat. No. 4,899,111 discloses another probehead for nuclear magnetic resonance spectroscopy allowing a spinning of the sample holder under a first angle and, concurrently, a nutation movement under a second angle.

Finally, European patent specification 0,136,642 discloses an apparatus for generating images of an object under investigation. The apparatus is a nuclear spin tomograph. The measuring coils of this apparatus are connected to a capacitor. The capacitor is adjusted by means of an ironless direct current motor located within the homogeneous basic field.

However, also this prior art apparatus has the disadvantage that relatively big masses are to be moved. Moreover, the ironless direct current motor of this prior art apparatus is located within the homogeneous main field.

It is, therefore, an object underlying the invention to further improve a spectrometer and a probehead of the kind mentioned at the outset such that the sample holder may be tilted rapidly and precisely under closed-loop control while using very simple components only.

SUMMARY OF THE INVENTION

This and other objects are achieved by a probehead within a nuclear magnetic resonance spectrometer, comprising:

- a magnet for generating a constant magnetic field having a principal field direction;
- a probehead arranged within the constant magnetic field and having a longitudinal axis extending along the principal field direction;
- a sample holder arranged within the probehead and supporting a sample under investigation, the sample holder having means for spinning the sample about a spinning axis, the spinning axis being tilted by a predetermined angle with respect to the longitudinal axis; and
- servo drive means for altering the angle, the servo drive means being actuated by a drive power derived from the magnetic field.

The object underlying the invention is thus entirely solved.

By taking advantage of the magnetic field being available anyway and having a considerable field strength, a high switching force or a high tilting torque, respectively, may be generated with relatively simple means. Further, the means may be located in very near vicinity to the sample holder so that only relatively small masses for rod assemblies or transmissions have to be displaced. Moreover, rigid transmissions or rod assemblies may be used resulting not only in a very short switching time but allowing, further, a precise position control of the sample holder. In particular, it is possible to approach the desired end positions with high velocity first and then to decelerate under appropriate control for avoiding shocks and vibrations that would cause malfunctions and errors within the measuring results.

According to a preferred embodiment of the probehead according to the invention the servo-mechanical means comprises a coil arranged within the magnetic field, means being provided for letting an electrical current flow through the coil, the variation of the angle being derived from a displacement of the coil caused by the current flow.

This measure has the advantage that by adjusting an electrical current in combination with an extremely simple electrical structure a high actuating force may be generated.

This holds true in particular when the coil is located within an inhomogeneous area of the magnetic field. If a magnetic field is generated that has a field gradient, the coil is preferably located at a point in which the product of field strength and gradient is at a maximum.

These measures have the advantage that a high actuating force may be achieved over the entire coil motion range with relatively low currents.

According to preferred embodiments of the invention the coil is swiveled within the magnetic field.

This measure has the advantage that the coil may be extremely simple journalled, namely on one end thereof only by using a hinge or another appropriate joint, wherein the swivel motion of the coil has to be transformed into a tilting motion of the sample holder.

According to a preferred embodiment of the invention the coil is an air-core coil.

This measure has the advantage that no influences on the magnetic field due to core materials may occur.

It is particularly preferred when an axial rod assembly is provided, the assembly being caused to slide under the action of the coil displacement, the rod assembly being configured for tilting the sample holder.

This measure has the advantage that a simple structure may be obtained having little influence only on the magnetic field homogeneity, in particular in elongate cylindrical probeheads as are used for superconducting magnet coils.

Preferably the sample holder may be tilted about an axis intersecting the longitudinal axis under right angles.

This measure has the advantage that the sample holder, for example, may be tilted about an axis intersecting its center of gravity so that the inertial moment and, hence, the torque required for tilting, are at a minimum.

With certain embodiments of the invention at least one terminal stop is provided for limiting the tilting motion of the sample holder. In particular, the terminal stop is configured to be calibrated at an adjustable position.

These measures, on the one hand side, have the advantage that the mechanical tilting motion of the sample holder may be limited. On the other hand, it is possible to calibrate the entire structure by the calibrated positional adjustment of the terminal stop or the terminal stops.

By making the terminal stop to act in a direction along the longitudinal axis, a particular simple construction is achieved, in particular if the probehead is of an axial design.

It is, further, preferred to couple the coil with a position sensor.

This measure, known per se, has the advantage that a closed-loop control of the sample holder position becomes possible.

According to a further preferred development of this embodiment the position sensor is a magneto-sensitive element, preferably a Hall-element being preferably located in a inhomogeneous area of the magnetic field.

This measure has the advantage that the position may be measured particularly simply and without contact because of its purely magnetic/electric nature.

In this respect it is particularly preferred to arrange the element on the coil.

This measure has the advantage that the position may be measured in direct vicinity of the sample holder so that measuring errors may be minimized. This holds true in particular as compared to the prior art structure discussed at the outset in which an elongate elastic element, namely a toothed belt, extends between the position sensor being an angular sensor on the stepped motor toothed wheel and the sample holder.

According to further embodiments of the invention the current may be adjusted by means of a control unit depending on a sensor output signal.

This measure, known per se, has the advantage that when the sample holder orientation is adjusted under closed-loop position control, certain velocity profiles may be set incorporating slow acceleration and slow deceleration corresponding to low-jolt velocity profiles.

Finally, certain embodiments of the invention are preferred incorporating an eddy current brake provided on the coil for dampening its motion.

This measure, too, has the advantage that the sample holder is moved with a particularly smooth motion profile since eddy current brakes counteract jolty accelerations and decelerations.

Further advantages may be taken from the description and the enclosed drawing.

It goes without saying that the features specified before and explained hereinafter may not only be used in the described combination but also in other combinations or alone without leaving the scope of the present invention.

BRIEF DESCRIPTION OF THE DRAWINGS

An embodiment of the invention is depicted in the drawing and will be described in more detail in the following description.

The only FIGURE shows a schematic side elevational view, partially as a sectional view, of an embodiment of a probehead according to the invention.

DETAILED DESCRIPTION OF THE PREFERRED EMBODIMENT

In the FIGURE reference numeral 10 designates a probehead as a whole that can be used for experiments as have become known under the name "dynamic-angle spinning" (DAS).

Probehead 10 is of essentially elongate cylindrical design. The FIGURE shows three portions of probehead 10 within which the components of interest are located. In a practical embodiment probehead 10 has, for example, a diameter in the order of 10 cm and an axial length of 80 cm.

A longitudinal axis of probehead 10 is designated with 11. Longitudinal axis 11 coincides with the principal direction of a constant magnetic field $H_0$ having field lines 12. Magnetic field $H_0$ is of high homogeneity at the sample location, however, becomes increasingly inhomogeneous in an axial direction as indicated in the FIGURE with slightly diverging field lines 12.

Probehead 10 is provided with an upper mounting plate 15 at its upper end and with a lower mounting plate 16 at its lower end.

A sample holder 20 is located adjacent lower mounting plate 16. Sample holder 20 comprises a stator 21 as well as a rotor 22 having an axis of rotation being designated by 23. Rotor 22 is journalled within stator 21 by means of airbearings 25, 26. Compressed air 28 may be fed via a channel as indicated at 27. Compressed air 28 is injected on a head 30 of rotor 22 being provided with turbine blade elements or depressions. Rotor 22 may, hence, be spinned within stator 28 at high revolutional speed.

Head 30 connects to a sample tube 31 containing a solid sample indicated at 32. Sample tube 31 is surrounded by an rf coil 33 being configured as a transmitter coil as well as a receiver coil for nuclear magnetic resonance experiments.

Insofar, sample holder 20 is of conventional magic angle spinning (MAS) sample holder design.

36 indicates a tilting axis for sample holder 20. Tilting axis 36 extends perpendicularly to longitudinal axis 11. Tilting axis 36 further, preferably intersects the center of gravity of sample holder 20.

By means of an actuator arm 40 being connected to sample holder 20, sample holder 20 may be tilted about its tilting axis 36 such that the inclination of rotational axis 23 with respect to longitudinal axis 11 may be varied. The FIGURE shows sample holder 20 in solid lines in a position in which the angle $\phi$ between rotational axis 23 and longitudinal axis 11 is set to be $\phi_1$. In contrast, the dash-dot lines illustrate a tilted position of sample holder 20' in which the angle was increased from $\phi_1$ to $\phi_2$. The angle $\phi$ may, hence, be set to be equal to the so-called "magic angle" of 54.70°, however, it may also be varied upwardly or downwardly in a broad range.

In the FIGURE, actuator arm 40 is journalled in a first joint 41 at its right free end. First joint 41 is located at the lower end of an actuator rod 42. Actuator rod 42 extends essentially parallel with respect to longitudinal axis 11. As can be seen from the portion of probehead 10 being depicted at the upper end of the FIGURE, actuator rod 42 extends through a through-bore 43 in upper mounting plate 15 and is, thus, guided both axially and radially.

As can be seen from the middle portion of probehead 10 in the FIGURE, actuator rod 42 in its middle section is provided with a second joint 46. A free end 49 of a coil holder 50 is articulated at second joint 46. The opposing terminal end 51 of coil holder 50, in contrast, is articulated to a third joint 52 being located at a stationary extension 53 of, for example, upper mounting plate 15. By doing so coil holder 50 may be swiveled about third joint 52 if actuator rod 52 is shifted to slide in an axial direction.

Coil holder 50 supports an air-core coil 56 being disposed essentially concentrical to longitudinal axis 11. Air-core coil 56 is provided with a connector element 57 which, by means of a supply line 58 is connected to an electronic control unit 60. A current I may be fed to air-core coil 56 via line 58.

Further, air-core coil 56 on its upper surface is provided with an eddy current brake 61 being configured as a conductive plate, for example a thin copper laminate.

Further, a Hall-element 65 is provided on the upper side of air-core coil 56 as a position sensor for the swiveled position of air-core coil 56. A connector element 66 of Hall-element 65 is also interconnected with control unit 60 by means of a line 67. Control unit 60, further, is provided with further inputs 68.

In the left hand side of the FIGURE a calibration rod assembly is depicted as identified with reference numeral 70.

Calibration rod assembly 70 essentially consists of an outer tube 71 and an inner rod 72 being slidebly disposed within outer tube 71. Inner rod 72 is provided with a lower terminal stop 75 and with a thread 76 at its lower terminal end. Thread 76 mates with a corresponding counter-thread within lower mounting plate 16. An upper free terminal end 77 of inner rod 72 extends beyond upper mounting plate 15 and may be gripped by hand.

Whereas lower terminal stop 75 is arranged below sample holder 20, an upper terminal stop 80 is located above sample holder 20. Upper terminal stop 80 is arranged at the lower terminal end of outer tube 71. Outer tube 71 is provided with a thread 81 at its upper terminal end, mating with a corresponding counter-thread within upper mounting plate 15. Outer tube 71 at its upper free terminal end is configured as a rotary knob 82 which can also be gripped by hand.

Upper free terminal end 77 as well as rotary knob 82 may be provided with appropriate scales, revolution counters and the like.

A fork-shaped arm 85 is integral with sample holder 70 at its left side as viewed in the FIGURE. Arm 85 encloses inner rod 72. The length of arm 85 is dimensioned such that the free terminal end of arm 85 comes to rest on lower terminal stop 75 and upper terminal stop 80, respectively, when sample holder 70 is in its end position of tilting motion about tilting axis 36.

The operation of probehead 10 is as follows:

For operating probehead 10 one has, first, to measure a calibration curve in which the signal (Hall voltage) $U_H$ of Hall-element 65 is depicted versus tilting angle $\phi$ of sample holder 20. When doing so, one has to take into account that Hall-element 65 is located within an inhomogeneous area of magnetic field $H_0$, such that Hall voltage $U_H$ is varied with the swivel position of air-core coil 56.

For measuring the calibration curve a predetermined axial position of terminal stops 75, 80 is set by a predetermined rotation of outer tube 71 and inner rod 72. The predetermined axial positions of terminal stops 75, 80 may be calculated from the pitch of threads 76, 81 and the number of revolutions of outer tube 71 and inner tube 72 as well as from their angular positions.

By feeding a current I to air-core coil 56, air-core coil 56 is swiveled. By consequence, actuator rod 42 is displaced in the direction of longitudinal axis 11 via second joint 46. Sample holder 20 is, hence, tilted about tilting axis 36 via actuator arm 40.

As the geometry of this structure is known, the angle $\phi$ may be determined versus Hall voltage $U_H$ when arm 85 comes to rest upon terminal stops 75, 80, respectively.

By using the calibrated curve, control unit 60 may be operated. For, it is possible to control current I to be maintained at a given value when a certain angular position $\phi$ or a predetermined Hall voltage $U_H$, coupled thereto, is reached. The current vs time profile can be varied within a broader range. For example, it is possible to increase current I first slowly and then rapidly and to approach the end value slowly again shortly prior to reaching the end position $\phi$ or the end voltage $U_H$. By doing so, jolty tilting motions of sample holder 20 and, hence, vibrations, are avoided.

A smooth motion profile may, further, be obtained by the action of eddy current brake 61 causing a damping effect when air-core coil 50 is rapidly moved through the inhomogeneous area of magnetic field $H_0$.

With a practical embodiment of a probehead 10 according to the invention, switch-over times in the order of 10 ms have been obtained, i.e. switch-over times being smaller than the relaxation time of conventional solid state samples. One can, therefore, excite sample 32 within probehead 10 in a first angular position and can then switch over the angular position within a time being shorter than the relaxation time for measuring the evolution of sample 32 within a second angular position.

What is claimed is:

1. A nuclear magnetic resonance spectrometer, comprising:
   a magnet for generating a constant magnetic field having a principal field direction;
   a probehead arranged within said constant magnetic field and having a longitudinal axis extending along said principal field direction;
   a sample holder arranged within said probehead and supporting a sample under investigation, said sample holder having means for spinning said sample about a spinning axis, said spinning axis being tilted by a predetermined angle with respect to said longitudinal axis; and
   servo drive means for altering said angle, said servo drive means being actuated by a drive power derived from said magnetic field.

2. The spectrometer of claim 1, wherein said servo drive means comprises a coil arranged within said magnetic field, means being provided for letting an electrical current flow through said coil, the variation of said angle being derived from a displacement of said coil caused by said current flow.

3. The spectrometer of claim 2, wherein said coil is coupled to a position sensor.

4. The spectrometer of claim 3, wherein said position sensor is a magneto-sensitive element being located within an inhomogeneous area of said magnetic field.

5. The spectrometer of claim 4, wherein said coil is arranged within an inhomogeneous area of said magnetic field and said element is arranged at said coil.

6. The spectrometer of claim 3, wherein said current can be adjusted by means of a control unit depending on a sensor output signal.

7. The spectrometer of claim 2, wherein said coil is provided with an eddy current brake for dampening coil motion.

8. The spectrometer of claim 2, wherein said coil is arranged within an inhomogeneous area of said magnetic field.

9. The spectrometer of claim 8, wherein said magnetic field has a field gradient, said coil being located at a point where the product of field strength and gradient is at a maximum.

10. The spectrometer of claim 2, wherein said coil is swiveled within said magnetic field.

11. The spectrometer of claim 2, wherein said coil is an air-core coil.

12. The spectrometer of claim 2, wherein an axial rod assembly is provided, said axial rod assembly being caused to slide under the action of coil displacement, said rod assembly being configured for tilting said sample holder.

13. The spectrometer of claim 1, wherein said sample holder is adapted to be tilted about an axis intersecting said longitudinal axis at right angles.

14. The spectrometer of claim 1, wherein a terminal stop is provided for limiting sample holder tilting motion.

15. The spectrometer of claim 14, wherein said terminal stop is configured to be calibrated at an adjustable position.

16. The spectrometer of claim 14, wherein said terminal stop acts in a direction along said longitudinal axis.

* * * * *

UNITED STATES PATENT AND TRADEMARK OFFICE
CERTIFICATE OF CORRECTION

PATENT NO. : 5,760,586
DATED : June 2, 1998
INVENTOR(S) : Hans Foerster and Klaus Zick It is certified that error appears in the above-identified patent and that said Letters Patent is hereby corrected as shown below:

On the title page please insert the following:

[73]    Assignee:    Bruker Analytische Messtechnik GMBH
                     Silberstreifen, D-76287 Rheinstetten-Forchheim
                     Federal Republic of Germany Signed and Sealed this Fifteenth Day of June, 1999

Attest:

Q. TODD DICKINSON

*Attesting Officer*    *Acting Commissioner of Patents and Trademarks*